United States Patent [19]

Yarwood et al.

[11] 4,289,946

[45] Sep. 15, 1981

[54] ELECTROMAGNETIC CASTING APPARATUS

[75] Inventors: John C. Yarwood, Madison; Ik Y. Yun, Orange; Derek E. Tyler, Cheshire; Peter J. Kindlmann, Northford, all of Conn.

[73] Assignee: Olin Corporation, New Haven, Conn.

[21] Appl. No.: 973,475

[22] Filed: Dec. 26, 1978

Related U.S. Application Data

[62] Division of Ser. No. 905,889, May 15, 1978, Pat. No. 4,161,206.

[51] Int. Cl.[3] ....................... H05B 6/06; G01R 27/26; B22D 27/02

[52] U.S. Cl. .................................... 164/503; 219/7.5; 219/10.77; 324/59; 164/154; 266/90

[58] Field of Search .................. 219/10.77, 10.75, 7.5, 219/482, 490, 497; 324/59, 57 R; 164/49, 51, 147, 250, 251; 266/90, 92, 94; 363/79, 80, 96, 97

[56] References Cited

U.S. PATENT DOCUMENTS

| | | | |
|---|---|---|---|
| 2,929,990 | 3/1960 | Maurer | 324/57 R |
| 3,029,380 | 4/1962 | Nicol | 324/59 X |
| 3,479,586 | 11/1969 | Perra | 324/57 R |
| 3,684,852 | 8/1972 | Seyfried | 219/10.77 X |
| 3,935,416 | 1/1976 | Cachat | 219/10.77 |
| 4,014,379 | 3/1977 | Getselev | 164/49 X |
| 4,074,185 | 2/1978 | Dardenne | 324/59 X |

FOREIGN PATENT DOCUMENTS

| | | | |
|---|---|---|---|
| 537750 | 3/1977 | U.S.S.R. | 164/49 |

*Primary Examiner*—Gene Z. Rubinson
*Assistant Examiner*—Philip H. Leung
*Attorney, Agent, or Firm*—Paul Weinstein

[57] ABSTRACT

An apparatus for casting metals wherein the molten metal is contained and formed into a desired shape by the application of an electromagnetic field. A control system is utilized to minimize variations in the gap between the molten metal and an inductor which applies the magnetic field. The gap or an electrical parameter related thereto is sensed and used to control the current to the inductor.

13 Claims, 4 Drawing Figures

ELECTROMAGNETIC CASTING APPARATUS

This is a division of application Ser. No. 905,889, filed May 15, 1978 U.S. Pat. No. 4,161,206.

BACKGROUND OF THE INVENTION

This invention relates to an improved process and apparatus for electromagnetically casting metals and alloys particularly copper and copper alloys. The electromagnetic casting process has been known and used for many years for continuously and semi-continuously casting metals and alloys. The process has been employed commercially for casting aluminum and aluminum alloys.

PRIOR ART STATEMENT

The electromagnetic casting apparatus comprises a three part mold consisting of a water cooled inductor, a non-magnetic screen and a manifold for applying cooling water to the ingot. Such an apparatus is exemplified in U.S. Pat. No. 3,467,166 to Getselev et al. Containment of the molten metal is achieved without direct contact between the molten metal and any component of the mold. Solidification of the molten metal is achieved by direct application of water from the cooling manifold to the ingot shell.

The cooling manifold may direct the water against the ingot from above, from within or from below the inductor as exemplified in U.S. Pat. Nos. 3,735,799 to Karlson and 3,646,988 to Getselev. In some prior art approaches the inductor is formed as part of the cooling manifold so that the cooling manifold supplies both coolant to solidify the casting and to cool the inductor as exemplified in U.S. Pat. Nos. 3,773,101 to Getselev and 4,004,631 to Goodrich et al.

The non-magnetic screen is utilized to properly shape the magnetic field for containing the molten metal as exemplified in U.S. Pat. No. 3,605,865 to Getselev. A variety of approaches with respect to non-magnetic screens are exemplified as well in the Karlson U.S. Pat. No. 3,735,799 and in U.S. Pat. No. 3,985,179 to Goodrich et al. Goodrich et al. U.S. Pat. No. 3,985,179 describes the use of a shaped inductor to shape the field. Similarly, a variety of inductor designs are set forth in the aforenoted patents and in U.S. Pat. No. 3,741,280 to Kozheurov et al.

While the above described patents describe electromagnetic casting molds for casting a single strand or ingot at a time the process can be applied to the casting of more than one strand or ingot simultaneously as exemplified in U.S. Pat. No. 3,702,155. In addition to the aforenoted patents a further description of the electromagnetic casting process can be found by reference to the following articles: "Continuous Casting with Formation of Ingot by Electromagnetic Field", by P. P. Mochalov and Z. N. Getselev, Tsvetnye Met., August, 1970, 43, pp. 62–63; "Formation of Ingot Surface during Continuous Casting", by G. A. Balakhontsev et al., Tsvetnye Met., August, 1970, 43, pp. 64–65; "Casting in an Electromagnetic Field", by Z. N. Getselev, J. of Metals, October, 1971, pp. 38–59; and "Alusuisse Experience with Electromagnetic Moulds", by H. A. Meier, G. B. Leconte and A. M. Odok, Light Metals, 1977, pp. 223–233.

When one attempts to employ the electromagnetic casting process for casting heavier metals than aluminum such as copper, copper alloys, steel, steel alloys, nickel, nickel alloys, etc. various problems arise in controlling the casting process. In the electromagnetic casting process the molten metal head is contained and held away from the mold walls by an electromagnetic pressure which counterbalances the hydrostatic pressure of the molten metal head. The hydrostatic pressure of the molten metal head is a function of the molten metal head height and the specific gravity of the molten metal.

When casting aluminum and aluminum alloys using the electromagnetic casting method, the molten metal head has a comparatively low density with a high surface tension due to the oxide film it forms. The surface tension is additive to the electromagnetic pressure and both act against the hydrostatic pressure of the molten metal head. A small fluctuation in the molten metal head therefore gives rise to a small difference in the magnetic pressure required for containment. For heavier metals and alloys such as copper and copper alloys, comparable changes in the molten metal head cause a greater change in hydrostatic pressure and in the required offsetting magnetic pressure. It has been found for copper and copper alloys that the change in magnetic pressure required for containment is approximately three times greater than for aluminum and aluminum alloys with comparable changes in molten metal head.

In order to obtain an ingot of uniform cross section over its full length the periphery of the ingot and molten metal head within the inductor must remain vertical especially near the liquid solid interface of the solidifying ingot shell. The actual location of the periphery of the ingot is affected by the plane over which the hydrostatic and magnetic pressures balance. Therefore, any variations in the absolute molten metal head height cause comparable variations in hydrostatic pressure which produce surface undulations along the length of the ingot. Those surface undulations are very undesirable and can cause reduced metal recovery during further processing.

It is apparent from the foregoing discussion that when one attempts to electromagnetically cast such heavy metals and alloys a greater degree of control is required to obtain the desired surface shape and condition in the resulting casting. In U.S. Pat. No. 4,014,379 to Getselev a control system is described for controlling the current flowing through the inductor responsive to deviations in the dimensions of the liquid zone (molten metal head) of the ingot from a prescribed value. In Getselev '379 the inductor voltage is controlled to regulate the inductor current in response to measured variations in the level of the surface of the liquid zone of the ingot. Control of the inductor voltage is achieved by an amplified error signal applied to the field winding of a frequency changer.

A drawback of the control system described in Getselev U.S. Pat. No. 4,014,379 is that only changes in the molten metal head due to fluctuation of the level of the surface of the liquid zone are taken into account. It appears that Getselev U.S. Pat. No. 4,014,379 has assumed that the location of the solidification front between the molten metal and the solidifying ingot shell is fixed with respect to the inductor. This is not believed to be the case in practice. Factors which tend to cause fluctuation in the vertical location of the solidification front include variations in casting speed, metal super heat, cooling water flow rate, cooling water application position, cooling water temperature and quality (impurity content) and inductor current amplitude and frequency.

Aluminum and aluminum alloys possess a narrow range of electrical resistivity. Therefore, in the electromagnetic casting process the depth to which eddy currents are generated in the molten metal head and solidifying ingot is comparatively uniform over a wide range of aluminum alloys. The depth of penetration of the electromagnetic induced current is a function of resistivity of the load and the frequency.

For copper and copper alloys as well as for other heavy metals and alloys there is a wide range of resistivity over the range of different alloys. Therefore, the range of penetration of the induced current at a constant frequency for such alloys is also comparatively wide as compared to aluminum. This is disadvantageous because the degree of magnetic stirring of the molten metal is a function of the penetration depth of the induced current.

For such heavy metals and alloys in changing from one alloy to another the operating frequency must be changed to obtain the desired penetration depth for the induced current. For example, for Alloy C 510 00 the induced penetration depth would be expected to be about 10 mm at 1 kHz, 5 mm at 4 kHz and 3 mm at 10 kHz. The penetration depth commonly used in electromagnetic casting of aluminum alloys is about 5 mm. As compared to Alloy C 510 00, pure copper achieves a 5 mm penetration depth at 2 kHz, half the frequency at which Alloy C 510 00 achieves that penetration depth. Therefore, the control system for the electromagnetic casting of metals such as copper and copper alloys must be capable of operating at a variety of frequencies in order to obtain the appropriate induced current penetration depth.

It is known in the art to utilize high frequency power supply equipment using solid state static inverters in place of motor generator sets. A particular advantage of such solid state inverters is that the equipment is operable over a wide frequency range.

The present invention overcomes the deficiencies described above and provides an accurate means for controlling the electromagnetic casting apparatus to allow casting of ingots of copper and copper base alloys and the like with uniform transverse dimensions over their length.

SUMMARY OF THE INVENTION

This invention relates to a process and apparatus for casting metals wherein the molten metal is contained and formed into a desired shape by the application of an electromagnetic field. In particular, an inductor is used to apply a magnetic field to the molten metal. The field itself is created by applying an alternating current to the inductor. In operation, the inductor is spaced from the molten metal by a gap which extends from the surface of the molten metal to the opposing surface of the inductor.

In accordance with this invention an improved process and apparatus is provided wherein a control system is utilized to minimize variations in the gap during operation of the casting apparatus. The control system includes a control circuit which is connected to the power supply which applies the alternating current to the inductor. The control circuit includes circuit means for sensing variations in the gap and means responsive thereto for controlling the magnitude of the current applied to the inductor so as to minimize the gap variation.

In accordance with a preferred embodiment an electrical parameter of the inductor is measured. The particular electrical parameter which is selected for measurement is one such as reactance or inductance which varies with the magnitude of the gap. Means are provided which are responsive to the measuring means for generating an error signal the magnitude of which is a function of the difference between the value of the measured electrical parameter and a predetermined value thereof. In response to the error signal, means are provided for controlling the current applied to the inductor in a manner so as to drive the error signal towards zero.

In another preferred embodiment the apparatus includes means for sensing the magnitude of the gap and means responsive thereto for generating an error signal the magnitude of which is a function of the difference between the sensed gap magnitude and a predetermined gap magnitude. In response to the error signal, means are provided for controlling the current applied to the inductor so as to return the gap to the predetermined magnitude.

The process and apparatus of this invention can be carried out using either analog or digital circuitry or combinations thereof.

Accordingly, it is an object of this invention to provide an improved process and apparatus for electromagnetically casting metals and alloys.

It is a further object of this invention to provide a process and apparatus as above wherein shape perturbations in the surface of the resultant casting are minimized.

It is a still further object of this invention to provide a process and apparatus as above wherein the gap between the molten metal and the inductor is sensed electrically and the current applied to the inductor is controlled in response thereto.

These and other objects will become more apparent from the following description and drawings.

DETAILED DESCRIPTION OF PREFERRED EMBODIMENTS

Figure 1:
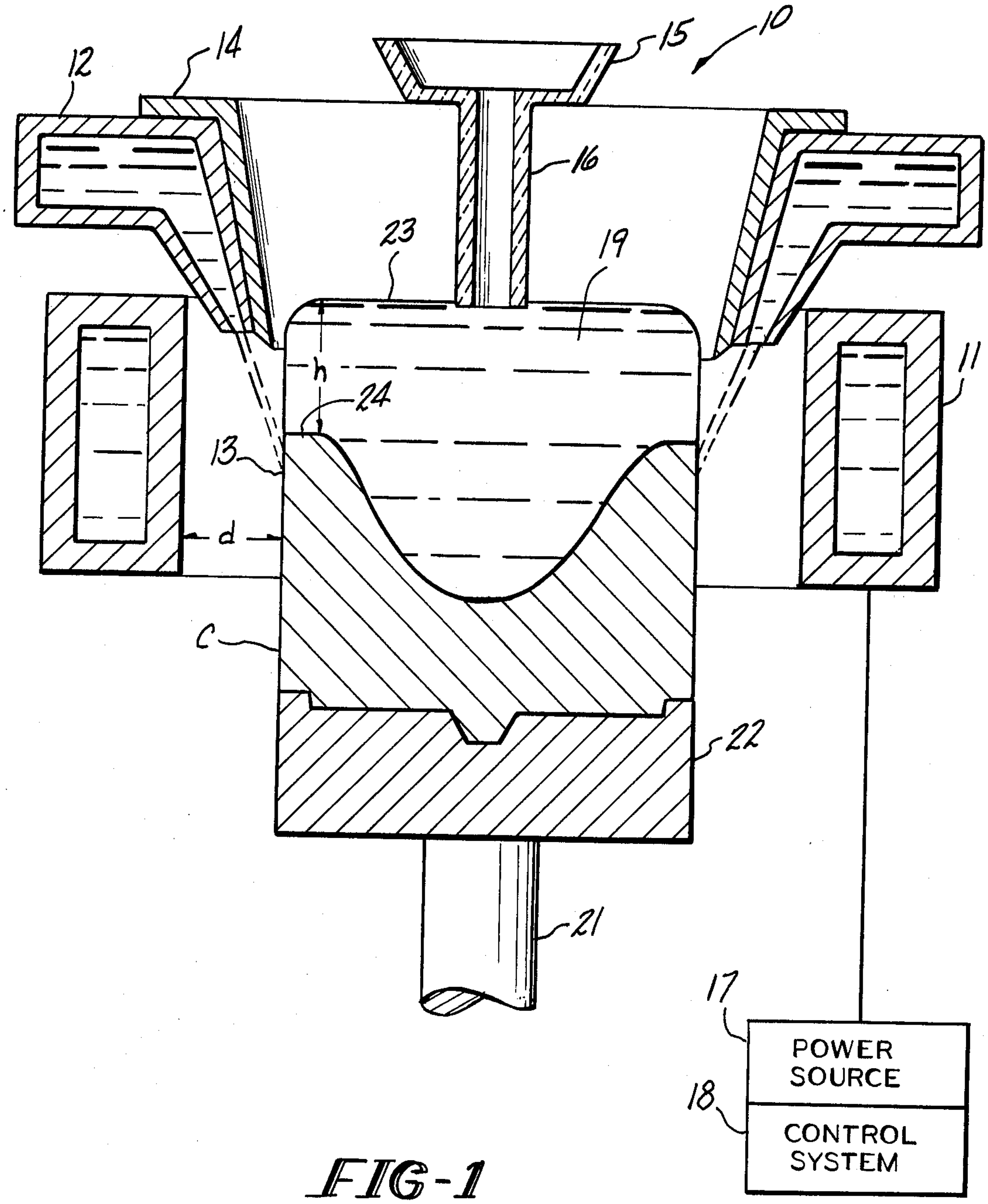
FIG. 1 is a schematic representation of an electromagnetic casting apparatus in accordance with the present invention.

Referring now to FIG. 1 there is shown by way of example an electromagnetic casting apparatus of this invention.

The electromagnetic casting mold 10 is comprised of an inductor 11 which is water cooled; a cooling manifold 12 for applying cooling water to the peripheral surface 13 of the metal being cast C; and a non-magnetic screen 14. Molten metal is continuously introduced into the mold 10 during a casting run, in the normal manner using a trough 15 and down spout 16 and conventional molten metal head control. The inductor 11 is excited by an alternating current from a power source 17 and control system 18 in accordance with this invention.

The alternating current in the inductor 11 produces a magnetic field which interacts with the molten metal head 19 to produce eddy currents therein. These eddy currents in turn interact with the magnetic field and produce forces which apply a magnetic pressure to the molten metal head 19 to contain it so that it solidifies in a desired ingot cross section.

An air gap d exists during casting, between the molten metal head 19 and the inductor 11. The molten metal head 19 is formed or molded into the same general shape as the inductor 11 thereby providing the desired ingot cross section. The inductor may have any desired shape including circular or rectangular as required to obtain the desired ingot C cross section.

The purpose of the non-magnetic screen 14 is to fine tune and balance the magnetic pressure with the hydrostatic pressure of the molten metal head 19. The non-magnetic screen 14 may comprise a separate element as shown or may, if desired be incorporated as a unitary part of the manifold for applying the coolant.

Initially, a conventional ram 21 and bottom block 22 is held in the magnetic containment zone of the mold 10 to allow the molten metal to be poured into the mold at the start of the casting run. The ram 21 and bottom block 22 are then uniformly withdrawn at a desired casting rate.

Solidification of the molten metal which is magnetically contained in the mold 10 is achieved by direct application of water from the cooling manifold 12 to the ingot surface 13. In the embodiment which is shown in FIG. 1 the water is applied to the ingot surface 13 within the confines of the inductor 11. The water may be applied to the ingot surface 13 above, within or below the inductor 11 as desired.

If desired any of the prior art mold constructions or other known arrangements of the electromagnetic casting apparatus as described in the Background of the Invention could be employed.

The present invention is concerned with the control of the casting process and apparatus 10 in order to provide cast ingots, which have a substantially uniform cross section over the length of the ingot and which are formed of metals and alloys such as copper and copper base alloys. This is accomplished in accordance with the present invention by sensing the electrical properties of the inductor 11 which are a function of the gap "d" between the inductor and the load, which is the ingot C and molten metal head 19.

It has been found in accordance with this invention that the inductance of the inductor 11 during operation is a function of the gap "d". The following equation is an expression of the relationship which is believed to exist between the inductance of the inductor and the gap spacing:

$$L_i = kd(2D_c - d) \tag{1}$$

where:

$L_i$ = inductance of the inductor;

$D_c$ = the inductor diameter;

d = the inductor-ingot separation (air gap);

k = a factor taking into account the geometrical parameters of the system including the level of the surface 23 of the molten metal head 19; the level of the solidification front 24 with respect to the inductor 11; the electrical conductivity of the metal being cast; and the current frequency.

"k" is determined empirically by measuring the inductance for a known inductor diameter and inductor ingot separation and solving for "k" in equation (1). The factor "k" does not vary with gap spacing "d". "k" varies only slightly with the height "h" of the molten metal head so long as the metal surface 23 is maintained in the vicinity of the top of the inductor 11.

Therefore, it is apparent that the inductance of the inductor-ingot system is a function of the gap spacing "d". The inductance is related to the reactance of the inductor-ingot system by the equation:

$$X_i = 2\pi f\, L_i \tag{2}$$

where:

$X_i$ = inductive reactance (ohms);

$L_i$ = inductance (henrys);

f = frequency (hertz).

The air gap "d" between the inductor 11 and the metal load 19 imposes the reactive load $X_i$ on the electrical power supply feeding the inductor. The magnitude of this inductive reactance "$X_i$" is a function of the current frequency "f", the size of the air gap "d", the inductor turns and the inductor height. Both the reactance "$X_i$" and the inductance "$L_i$" are relatively independent of the alloy being cast as compared to resistance.

The combination of the inductor 11 and the metal load 19 which it surrounds imposes a resistive load as well on the electrical power supply feeding the inductor. The magnitude of the resistive load is a function of the geometry (size) of the inductor 11 and the metal load 19 and the resistivities of both. The combination of the resistive and reactive loads described above results in a total impedance "$Z_i$" through which the containment current "I" must pass. This total impedance is defined in ohms as:

$$Z_i \simeq \sqrt{R_i^2 + (2\pi f\, L_i)^2} \tag{3}$$

where: $Z_i$ = impedance (ohms); $R_i$ = resistance (ohms); f = frequency (hertz) and $L_i$ = inductance (henrys).

Variation in load cross section namely the cross section of the molten metal head 19 will result in changes in the electrical loading of the inductor 11. If a constant voltage is applied across the inductor 11 as in Getselev U.S. Pat. No. 4,014,379, the containment process balances the hydrostatic pressure of the molten metal head 19 and the magnetic pressure of the electromagnetic forces to provide inherent control characteristics. Accordingly, an increase in molten metal head will tend to overcome the magnetic pressure and result in a larger ingot section. This in turn will reduce the gap "d" or ingot-inductor separation and thereby lower the impedance "$Z_i$" and inductance "$L_i$" of the system. Getselev U.S. Pat. No. 4,014,379 suggests this effect is based on a change in resistance associated with the increasing size of the ingot. However, it is believed that impedance rather than resistance is the controlling property. The inductor current amplitude "$I_i$" and, hence, the induced current amplitude is increased thereby in accordance with the equation:

$$I_i = V_i / Z_i \tag{4}$$

where:

$I_i$ = the current;

$V_i$ = the voltage; and $Z_i$ = the impedance; so that the ingot reverts to its original size.

Inasmuch as this is a dynamic process, shape perturbations or undulations will be formed in the resultant ingot surface 13. It is anticipated that such perturbations would occur in characteristic time periods on the order of a second. In order to counteract these effects by electrical control means the response rate of the power supply 17 and control system 18 should be considerably more rapid. Accordingly, a response time of 100 milliseconds or less is desirable.

As described above, inductance or reactance of the loaded inductor 11 are functions of the gap size "d". In the prior art approach of the Getselev U.S. Pat. No. 4,014,379 a constant voltage is maintained across the inductor and a corrective voltage responsive to the height of the surface of the molten metal head is employed to control the inductor current. In contrast thereto, in accordance with the present invention, an electrical property of the casting apparatus 10 which is a function of the gap "d" between the molten metal head 19 and interior surface and the inductor 11 is sensed and a signal representative thereof is generated. Responsive to the gap signal the power supply 17 output is controlled to provide an appropriate frequency, voltage and current so as to maintain the gap "d" substantially constant.

It is the current applied to the inductor 11 which is the principal factor in generating the electromagnetic pressure. That current is a function of the applied voltage and the impedance of the loaded inductor which in turn is a function of frequency and inductance. It is possible in accordance with the present invention to control the applied current by adjustment of the voltage output of the power supply 17 at a constant frequency or by adjustment of the frequency of the power supply 17 at a constant voltage or by adjustment of the frequency and voltage in combination.

Figure 2:
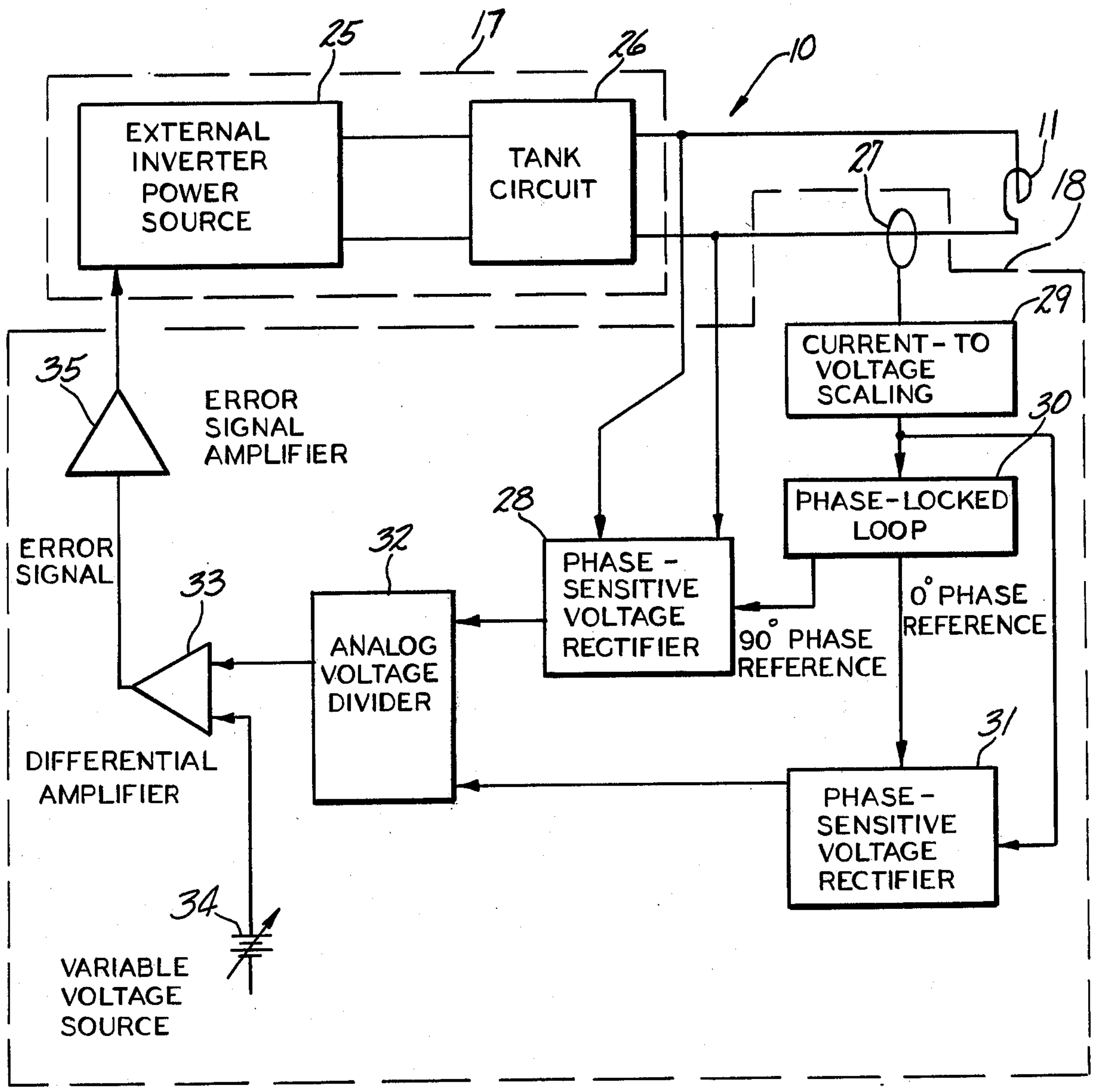
FIG. 2 is a block diagram of a control system in accordance with one embodiment of this invention.

Referring now to FIGS. 1 and 2 there is shown by way of example a control circuit 18 for controlling the power supply 17 of the electromagnetic casting apparatus 10. The purpose of the control circuit is to insure that the gap "d" is maintained substantially constant so that only minor variations, if any, occur therein. By minimizing any variation in the gap "d" shape perturbations in the surface 13 of the casting C will be minimized.

The inductor 11 is connected to an electrical power supply 17 which provides the necessary current at a desired frequency and voltage. A typical power supply circuit may be considered as two subcircuits 25 and 26. An external circuit 25 consists essentially of a solid state generator providing an electrical potential across the load or tank circuit 26 which includes the inductor 11. This latter circuit 26 except for the inductor 11 is sometimes referred to as a heat station and includes elements such as capacitors and transformers.

In accordance with this invention the generator circuit 25 is preferably a solid state inverter. A solid state inverter is preferred because it is possible to provide a selectable frequency output over a range of frequencies. This in turn makes it possible to control the penetration depth of the current in the load as described above. Both the solid state inverter 25 and the tank circuit 26 or heat station may be of a conventional design. The power supply 17 is provided with front end DC voltage control in order to separate the voltage and frequency functions of the supply.

In accordance with the present invention changes in electrical parameters of the inductor-ingot system are sensed in order to sense changes in the gap "d". Any desired parameters or signals which are a function of the gap "d" could be sensed. Preferably, in accordance with this invention the reactance of the inductor 11 and its load is used as a controlling parameter and most preferably the inductance of the inductor and its load is used. Both of these parameters are a function of the gap between the inductor 11 and the load 19. However, if desired, other parameters which are affected by the gap could be used such as impedance and power. Impedance is a less desirable parameter because it is also a function of the resistive load which changes with the diameter of the load (ingot) in a generally complex fashion.

The reactance of the inductor 11 and load 19 may be sensed as in FIG. 2 by measuring the voltage across the inductor 11 90° out of phase to the current and dividing that signal by the current measured in the inductor. For a fixed frequency mode of operation the reactance will be directly proportional to the inductance, as in equation (2) above. Therefore, for a fixed frequency mode the measured reactance is a function of the gap "d" in accordance with equation (1) above. If the frequency is not fixed during operation, then it is preferably to determine the inductance of the inductor 11 and its load 19 which can be done by dividing the reactance by a factor comprising $2\pi f$.

Referring again to FIG. 2, the control circuit 18 described therein is principally applicable to an arrangement wherein the frequency of the power supply 17 during operation is maintained fixed at some preselected frequency. Therefore, with this control circuit 18 it is only necessary to measure a change in the reactance of the inductor 11 and load 19 to obtain a signal indicative of a change in gap "d".

The output waveform of solid state power sources 17 contains harmonics. The amplitude of these harmonics relative to the fundamental frequency will depend on a large number of factors, such as ingot type and diameter, and the characteristics of power-handling components in the power source (e.g. the impedance matching transformer). The intended in-process electrical parameter measurement preferably should be done at the fundamental frequency so as to eliminate errors due to harmonics admixture.

A current transformer 27 senses the current in inductor 11. A current-to-voltage scaling resistor network 29 generates a corresponding voltage. This voltage is fed to a phase-locked loop circuit 30 which "locks" on to the fundamental of the current waveform and generates two sinusoidal phase reference outputs, with phase angles of 0° and 90° with respect to the current fundamental. Using the 0° phase reference, phase-sensitive rectifier 31 derives the fundamental frequency current amplitude. The 90° phase reference is applied to phase-sensitive rectifier 28 which derives the fundamental voltage amplitude due to inductive reactance. The voltage signals from 28 and 31 which are properly scaled are then fed to an analog voltage divider 32 wherein the voltage from rectifier 28 is divided by the voltage from rectifier 31 to obtain an output signal which is proportional to the reactance of the inductor 11 and load 19. The output signal of the divider 32 is applied to the inverting input of a differential amplifier 33 operating in a linear mode. The non-inverting input of the amplifier 33 is connected to an adjustable voltage source 34. The output of amplifier 33 is fed to an error signal amplifier 35 to provide a voltage error signal which is applied to the power supply external circuit 25 in order to provide a feedback control thereof. Amplifier 35 preferably also contains frequency compensation circuits for adjusting the dynamic behavior of the overall feedback loop.

The error signal from the differential amplifier 33 is proportional to the variation in the reactance of the inductor 11 and load 19 and also corresponds in sense or polarity to the direction of the variation in the reactance. The adjustable voltage source provides a means for adjusting the gap "d" to a desired set point. The feedback control system 18 provides a means for driving the variation in the gap "d" to a minimum value or zero. The control system 18 described by reference to FIG. 2 is principally applicable in a mode of operation wherein the frequency once set is held constant though it is not necessarily limited to that mode of operation particularly for small changes in frequency.

Filtering circuits other than a phase-locked loop circuit 30 may be used to extract the fundamental frequency component. For example, both current and voltage waveforms can be examined at 0° and 90° with respect to an arbitrary phase reference, such as may be extracted from the inverter drive circuitry of the power supply 17. These in-phase (0°) and quadrature components (90°) can then be combined vectorially to yield voltages proportional to the fundamental frequency and current through the inductor 11.

Figure 3:
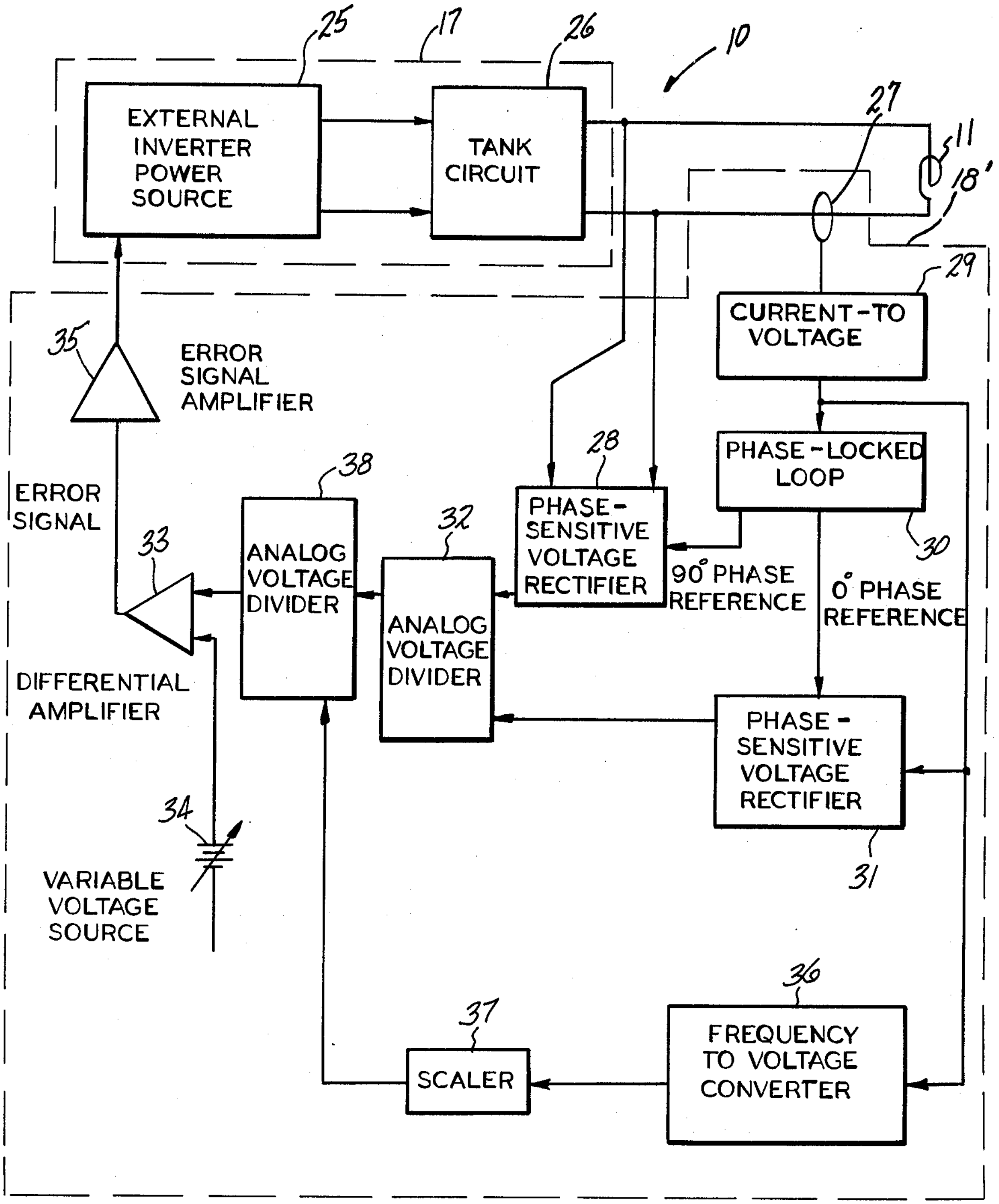
FIG. 3 is a block diagram of a control system in accordance with another embodiment of this invention.

The circuit of FIG. 2 could be modified as in FIG. 3 wherein like circuit elements have the same reference numerals as in FIG. 2 and operate in the same manner. In the circuit 18' of FIG. 3 the frequency of the current applied to the inductor 11 is sensed and a voltage signal proportionate thereto is generated by a frequency to voltage converter 36 connected to the output of the current to voltage scaling circuit 29. The output of the converter 36 is properly scaled to the output of the divider 32 by scaling circuit 37. A second analog voltage divider 38 is provided for dividing the output of the first voltage divider 32 by the proportionate voltage from the frequency to voltage converter 36. The output signal of the second divider 38 approximates the inductance of the inductor 11 and load 19 and thereby allows the control system 18' to operate even in a variable frequency mode of operation.

The approaches to the control systems 18 and 18' of this invention which have been described thus far have employed analog type circuitry. If desired, however, in accordance with this invention even greater flexibility of control can be accomplished by utilizing a digital control system 18" as exemplified by the block circuit diagram of FIG. 4. The power supply 17 including the external circuit 25 and tank circuit 26 are essentially the same as described by reference to FIGS. 2 and 3.

In this embodiment, a differential amplifier 39 is utilized to sense the voltage across the inductor 11. A current transformer 27 is utilized to sense the current in the inductor 11. The output of the differential amplifier is fed to a filter circuit F for extracting the fundamental frequency. The output of filter F is fed to a frequency/voltage converter 40. The output signal of the frequency/voltage converter 40 comprises a signal "f" proportionate to the frequency of the applied current. The output of the differential amplifier 39 is also applied as one input to an AC power meter 41. The other input thereto comprises the current signal sensed by the current transformer 27 as filtered by filter circuit F' which extracts the fundamental frequency. The AC power meter 41 provides output signals proportional to the RMS voltage "V", the RMS current "I" and the true power "kW" applied to the inductor 11.

The frequency output signal "f" from the converter 40 and the voltage "V" current "I" and power "kW" signals from the AC power meter 41 are fed to an analog to digital converter 42 which converts them into an appropriate digital form. The output of the analog to digital converter is fed to a computer 43 such as a minicomputer or microprocessor as, for example, a PDP-8 with Dec Pack manufactured by Digital Equipment, Inc. The computer 43 is programmed to use the values of frequency "f", voltage "V", current "I" and power "kW" which are fed to it to compute the respective values of apparent power "kVA", phase angle "$\theta$", impedance "Z", reactance "X", and inductance "L". The computer can be programmed to calculate these parameters using the following relationships: $kVA = V \cdot I$, $\theta = COS^{-1}$ (kW/kVA), $Z = V/I$, $X = Z \sin \theta$ and $L = X/(2 \pi f)$. Each of the aforenoted relationships is well known and allows the computation of the inductance of the inductor-load in operation. After calculating the inductance the computer 43 then calculates the gap "$d_c$" using formula (1) above. The computer 43 then compares the calculated gap "$d_c$" to a predetermined gap setting "d" in its memory and generates a preprogrammed error signal corresponding to the difference between "d" and "$d_c$". The error signal is then fed to a digital to analog converter 44 to convert the error signal into analog form. One output signal of the digital to analog converter 44 is applied to a voltage controller 45 and another output signal thereof is applied to a frequency controller 46. The outputs of the voltage 45 and frequency 46 controllers are each respectively tied to the power supply 17 to feedback to the power supply the error signals for adjusting the current in the inductor to compensate for the gap variation so as to drive the variation toward zero.

The control system 18" which has just been described can be operated in any of three modes of operation. It can operate in a fixed frequency mode wherein only the voltage is changed to adjust the current applied to the inductor 11. In this mode of operation the frequency controller 46 would be rendered inoperative and it is possible to compute a correction or error signal from the computed value of reactance "X" rather than having to compute the inductance "L" since they would be directly proportional.

Figure 4:
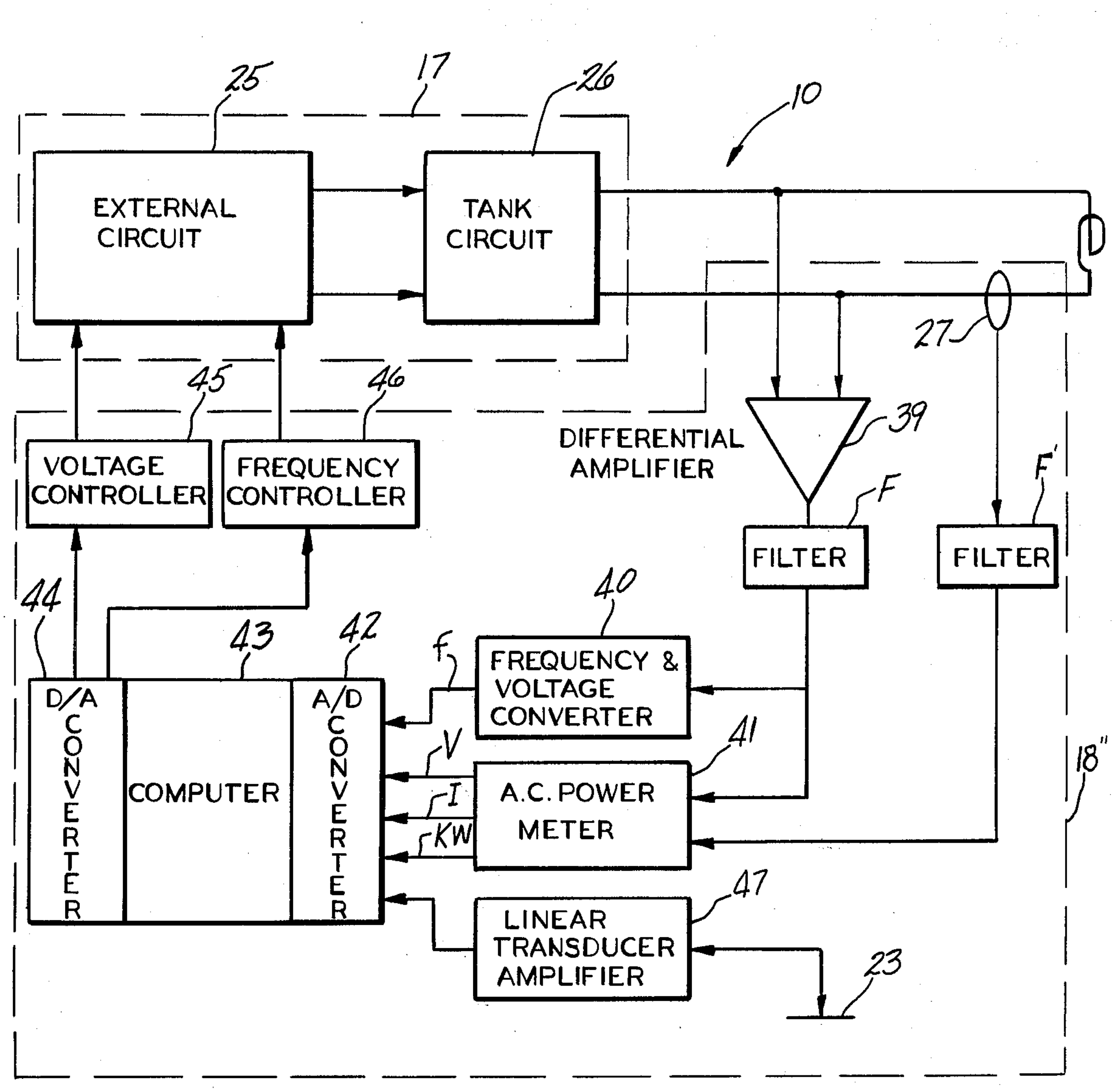
FIG. 4 is a block diagram of a control system in accordance with a different embodiment of this invention.

The control system 18" of FIG. 4 can also be operated in a fixed voltage mode wherein only frequency is varied in order to control the inductor 11 current. In this mode of operation the voltage controller 45 would be rendered inoperative and only the frequency controller would apply an error signal to the power supply. Finally, digital operation as exemplified in FIG. 4 is amenable to varying both the frequency and voltage in order to control the inductor 11 current. In this mode, both the voltage 45 and frequency 46 controllers would be operative.

While the operation of the control system 18" of FIG. 4 has been described by reference to comparison of a sensed gap magnitude to a predetermined gap magnitude for generating an error signal, it could also be operated in a fashion similar to that described by reference to FIGS. 2 and 3. For example, instead of computing the sensed gap magnitude it could merely compute sensed reactance or inductance in accordance with the above equations and compare the computed value of reactance or inductance to some preprogrammed preset value thereof and generate a preprogrammed error signal in response to the variation from the preset value. This approach would advantageously require less computation than the approach wherein the sensed gap magnitude is calculated.

The control circuit 18″ described by reference to FIG. 4 is desirable because of the very high speed with which the computations and correction signals can be generated by the computer 43 and the high degree of sensitivity and flexibility associated with the use of digital circuitry and computer programming.

While a phase-locked loop circuit is preferred for use as a filter 30, F and F′, to extract the fundamental frequency of the sensed signal, any desired filtering circuit could be used for that purpose.

The apparatus 10 of this invention can be utilized without the need to sense the top surface 23 of the liquid metal head 19. This is the case because the parameters which are used are functions of the gap spaced "d" and are not greatly affected by the height "h" of the molten metal head 19. If desired, however, for the purpose of fine tuning the apparatus 10 the upper surface 23 of the molten metal head 19 can be sensed in the same manner as in the Getselev U.S. Pat. No. 4,014,379 to generate a signal responsive to the height thereof, as by the use of a linear transducer 47 such as Model 350 manufactured by Trans-Tek, Inc. The output of the transducer 47 is then applied to the analog to digital converter 42 which converts the analog signal to a digital one. The digital molten metal head height signal is then compared by the computer 43 to a desired set value preprogrammed therein and an error signal corresponding to any difference therebetween is generated by the computer. The computer 43 then combines its error signal due to gap variation and its error signal due to head height variation and generates an appropriate combined error signal which is applied to control the power supply 17 in the same manner as described above.

While the load has been described above as an ingot, it could comprise any desired type of continuously or semicontinuously cast shape such as rods, bars, etc.

Where the term inductor diameter has been employed in this application an effective inductor diameter can be substituted therefor for non-circular inductors 11. The effective inductor diameter is computed by measuring the area defined by the inductor 11 and then computing its effective diameter from that measured area as if it were for a circular inductor.

While the invention has been described by reference to copper and copper base alloys it is believed that the apparatus and process described above can be applied to a wide range of metals and alloys including nickel and nickel alloys, steel and steel alloys, aluminum and aluminum alloys, etc.

The programming of the computer 43 and its memory can be carried out in a conventional manner and, therefore, such programming does not form a part of the invention herein.

While the control circuitry 18, 18′, 18″ has been described by specific reference to its application in an electromagnetic casting apparatus it is believed to have application in part or in whole to other kinds of metal treatment apparatuses wherein inductors are used to apply a magnetic field to a metal load. In particular, the circuitry for sensing the inductance in the inductor could have application, for example, in induction furnaces.

The U.S. patents set forth in this application are intended to be incorporated by reference herein.

It is apparent that there has been provided in accordance with this invention an electromagnetic casting apparatus and process which fully satisfies the objects, means and advantages set forth hereinbefore. While the invention has been described in combination with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

What is claimed is:

1. In an apparatus for casting materials such as metals comprising:

induction means for applying a magnetic field to said material and solid state inverter means for applying an alternating current to said induction means to generate said magnetic field the improvement wherein:

means are provided for sensing a reactive parameter corresponding about to the reactance or inductance of said induction means, said reactive parameter sensing means comprising:

means for sensing a voltage signal applied to said induction means;

means for sensing a current signal applied to said induction means;

circuit means for filtering said voltage and current signals to extract the fundamental frequency thereof; and circuit means receiving said filtered voltage and current signals for generating a signal corresponding about to said reactance or inductance of said induction means.

2. In an apparatus as in claim 1, feedback control means receiving said reactance or inductance signal for controlling the output of said means for applying said alternating current.

3. In an apparatus as in claim 1 wherein said filtering means comprises a phase-locked loop circuit.

4. In an apparatus as in claim 3 wherein said reactive parameter comprises reactance.

5. In an apparatus as in claim 3 wherein said reactive parameter comprises inductance.

6. In an apparatus for casting materials such as metals comprising:

induction means for applying a magnetic field to said material and means for applying an alternating current to said induction means to generate said magnetic field; the improvement wherein said apparatus further includes:

means for sensing the voltage applied to said induction means 90° out of phase to the current applied to said induction means and for generating a phase sensitive voltage signal corresponding thereto;

means for sensing the current applied to said induction means for generating a voltage signal corresponding thereto; and divider circuit means for dividing said phase sensitive voltage signal by said voltage signal corresponding to said current for generating a signal corresponding about to the reactance of said induction means.

7. In an apparatus as in claim 6 wherein said means for sensing said voltage 90° out of phase to said current comprises means for generating a phase reference signal with a phase angle of 90° means for sensing the voltage applied to said induction means and means receiving said phase reference signal and said voltage signal for providing said phase sensitive voltage signal.

8. In an apparatus as in claim 7 wherein said means for generating said phase reference signal with a phase angle of 90° comprises a phase-locked loop circuit.

9. In an apparatus as in claim 6 wherein means are provided for sensing the frequency of said current applied to said induction means for providing a frequency signal corresponding thereto and means are provided for dividing said reactance signal by said frequency signal to generate a signal corresponding about to the inductance of said induction means.

10. In an apparatus as in claim 9, feedback control means receiving said inductance signal for controlling the output of said means for applying said alternating current.

11. In an apparatus as in claim 9 wherein said means for sensing said voltage 90° out of phase to said current comprises means for generating a phase reference signal with a phase angle of 90°, means for sensing the voltage applied to said induction means and means receiving said phase reference signal and said voltage signal for providing said phase sensitive voltage signal.

12. In an apparatus as in claim 11 wherein said means for generating said phase reference signal with a phase angle of 90° comprises a phase-locked loop circuit.

13. In an apparatus as in claim 6, feedback control means receiving said reactance signal for controlling the output of said means for applying said alternating current.

* * * * *